United States Patent [19]

Gray

[11] Patent Number: 5,350,480
[45] Date of Patent: Sep. 27, 1994

[54] SURFACE CLEANING AND CONDITIONING USING HOT NEUTRAL GAS BEAM ARRAY

[75] Inventor: David C. Gray, Sunnyvale, Calif.

[73] Assignee: Aspect International, Inc., Pittsburgh, Pa.

[21] Appl. No.: 96,928

[22] Filed: Jul. 23, 1993

[51] Int. Cl.$^5$ .......................................... H01L 21/00
[52] U.S. Cl. ................................ 156/345; 156/646; 134/31; 134/902
[58] Field of Search ..................... 156/646, 345; 204/298.36, 192.34; 118/715, 724; 134/31, 902

[56] References Cited

U.S. PATENT DOCUMENTS

| | | | |
|---|---|---|---|
| 4,540,466 | 9/1985 | Nishizawa | 156/643 |
| 4,734,152 | 3/1988 | Geis et al. | 156/646 |
| 4,774,416 | 9/1988 | Askary et al. | 250/492.2 |
| 4,886,571 | 12/1989 | Suzuki et al. | 156/646 |
| 4,901,667 | 2/1990 | Suzuki et al. | 118/719 |
| 5,108,535 | 4/1992 | Ono et al. | 156/345 |
| 5,108,543 | 4/1992 | Suzuki et al. | 156/643 |
| 5,108,778 | 4/1992 | Suzuki et al. | 427/38 |
| 5,110,407 | 5/1992 | Ono et al. | 156/643 |
| 5,174,855 | 12/1992 | Tanaka | 156/345 X |
| 5,188,671 | 2/1993 | Zinck et al. | 118/715 |
| 5,248,380 | 9/1993 | Tanaka | 156/646 X |
| 5,286,331 | 2/1994 | Chen et al. | 156/345 |
| 5,288,684 | 2/1994 | Yamazaki et al. | 156/345 X |

OTHER PUBLICATIONS

Ruzyllo, J., "Evaluating the Feasibility of Dry Cleaning of Silicon Wafers", *Micrtocontamination*, pp. 39–43, Mar., 1988.

Coburn, J., "Dual Atom Beam Studies of Etching and Related Surface Chemistries", *Pure and Appl. Chem.*, vol. 64, No. 5, pp. 709–713, 1992.

Geis, M., Efremow, N., Pang, S. and Anderson, A., "Hot-jet etching of Pb, GaAs, and Si", *J. Vac. Sci. Technol. B*, vol. 5, No. 1, Jan./Feb., 1987.

Chuang, T., "Multiple Photon Excited SF$_6$ Interaction with Silicon Surfaces", *J. Chem. Phys.*, vol. 74, No. 2, pp. 1453–1460, 1981.

Suzuki, K., Hiraoka, S. and Nishimatsu, S., "Anisotropic Etching of Polycrystalline Silicon with a Hot Cl$_2$ Molecular Beam", *J. Appl. Phys.*, vol. 64, No. 7, pp. 3697–3705, 1988.

Suzuki, K., Ninomiya, K., Nishimatsu, S. and Okada, O., "Si Etching with a Hot SF$_6$ Beam and the Etching Mechanism", *Jpn. Appl. Phys.*, 26, pp. 166–173, 1987.

(List continued on next page.)

*Primary Examiner*—Thi Dang
*Attorney, Agent, or Firm*—Webb Ziesenheim Bruening Logsdon Orkin & Hanson

[57] ABSTRACT

An apparatus for generating large arrays of directed beams containing thermally excited, electrically neutral gas species, including vibrationally excited molecules, free radicals, and atoms, is disclosed. A heated plate in which a designed array of long, narrow channels are formed serves both to activate and collimate the gas species, and separates a high pressure reservoir of reactive gas from an evacuated region which serves as the material processing chamber. Selection of the appropriate reservoir pressure and channel geometry facilitates the thermal excitation of the reactive gas through collisions with hot channel walls, and the formation of directed non-collisional beams which may be readily transported through the evacuated chamber. The heated channel array plate is designed to allow good gas flux uniformity over a large target area by appropriately setting the pitch spacing and aspect ratio of the channels. Impingement of the thermally excited neutral gas species on a target material allows cleaning of surface contaminations and residues, removal of material surface layers without causing ballistic damage, or reactive modification of the surface layers. The directionality or angular divergence of the beams may be tuned to adjust the anisotropy of the surface cleaning and/or etching, allowing transport of thermally excited species into high aspect ratio target surface structures.

23 Claims, 9 Drawing Sheets

OTHER PUBLICATIONS

Vasile, M. and Stevie, F., "Reaction of Atomic Fluorine with Silicon: The Gas Phase Products", *J. Appl. Phys.*, vol. 53, No.5, pp. 3799–3805, May 1982.

Jones, R., Olander, D. and Kruger, V., "Molecular-Beam Sources Fabricated from Multichannel Arrays. I. Angular Distributions and Peaking Factors", *J. Appl. Phys.*, 40, No. 11, pp. 4641–4649. 1969.

Glines, A., Carter, R. and Anton, A, "An alternative for gas dosing in ultrahigh vacuum adsorption studies", *Rev. Sci. Instrum.*, vol. 63, No. 2, pp. 1826–1833, Feb., 1992.

Gray, D. and Sawin, H., "Design considerations for high-flux collisionally opaque molecular beams", *J. Vac. Sci. Technol. A*, vol. 10, No. 5, pp. 3229–3238, 1992.

Girodmaine, J. and Wang, T., "Molecular Beam Formation By Long Parallel Tubes*", *J. Appl. Phys.*, vol. 31, No. 3, pp. 463–471, 1960.

Murphy, D., "Wall collisions, angular flux, and pumping requirements in molecular flow through tubes and microchannel arrays", *J. Vac. Sci. Technol. A*, vol. 7, No. 5, pp. 3075–3091, Sep./Oct., 1989.

Saito, Y., Yamaoka, O. and Yoshida, A., "Plasmaless Etching of Silicon Using Chlorine Trifluoride", *J. Vac. Sci. Technol. B*, vol. 9, No. 5, pp. 2503–2506, Sep./Oct., 1991.

SURFACE CLEANING AND CONDITIONING USING HOT NEUTRAL GAS BEAM ARRAY

BACKGROUND OF THE INVENTION

1. Field of Invention

This invention relates to the processing of electronic, optical and other materials and, more particularly, to the cleaning or chemical conditioning of semiconductor wafer surfaces and to the etching or reactive modification of semiconductor surface layers.

2. Description of the Prior Art

The current state of the art in ULSI chip fabrication involves the repeated deposition or growth, patterning, and etching of thin films of semiconductor, metal, and dielectric materials. Between these process steps are typically thirty or more steps which involve cleaning of surface contaminants and residues, removal of damaged surface layers, and/or chemical conditioning of the material surface to optimize subsequent processing. Traditional wafer cleaning and conditioning steps involve wet chemical processes such as the "RCA standard clean" and a variety of HF acid dips or sprays, followed by ultra-pure water rinses. These processes facilitate the removal of organic contaminants and trace metals through selective chemical reactions, as well as the removal (etching) of contaminated and damaged substrate layers to expose a pristine surface for subsequent processing. However, the use of wet chemical processes in semiconductor fabrication is increasingly undesirable due to the expense and hazards of wet chemical handling, surface tension limitations to liquid permeation into submicron features, and the high level of metallic and particulate contamination in the wet process chemicals.

The industry trend in semiconductor manufacture is toward the clustering of sequential single wafer processes in which atmospheric exposure of the substrate wafers is limited by introducing gas-phase or "dry" wafer cleaning and conditioning processes. To function as successful replacements for traditional wet cleaning processes, these "dry" cleaning processes must facilitate the removal of organic, metallic and other contaminants, and allow "light" (non-aggressive) etching of damaged and contaminated surface layers via gas-phase reactions with the substrate material. In addition to cleaning and conditioning planar surfaces, these processes must allow cleaning of high aspect ratio features in the substrate material such as deep trenches and vias, where contaminated layers may exist on the bottoms and/or sidewalls.

It is an object of the present invention to allow the gas-phase cleaning, conditioning, and damage-free removal of contaminated layers with such directional facility.

Etching, or subtractive processing of a patterned film, is an example of a previously "wet" chemical process step in semiconductor manufacturing which is now commonly performed in the gas-phase through exposure of the wafer surface to a glow discharge or plasma of a reactive gas. It has been established that gas-phase free radicals such as F, Cl, and Br allow the etching of Si, $SiO_2$ and other semiconductor materials (for instance Cl will etch GaAs and InP) through the formation of volatile substrate products. These radical species are generated in large concentrations in plasma or dry etching processes, and the interaction between chemisorbed free radicals and energetic ions from the plasma results in rapid directional etching. There is significant interest in the use of gas plasmas and plasma products in wafer cleaning processes as well. Ruzyllo, J., "Evaluating the Feasibility of Dry Cleaning of Silicon Wafers" *Microcontamination*, pp. 39–43 March 1988. However, plasma etching and cleaning processes suffer from the shortcoming that thin films, such as $SiO_2$ gate dielectric layers, can be damaged by the high energy particle bombardment, the ultraviolet (UV) radiation, and/or the electrical nonuniformities generated in the plasma environment. To avoid structural damage of such thin films, etchant particle energies must be reduced below the material lattice displacement energies, which are typically on the order of 10 eV. Recent developments in high density plasma reactors, which use inductive coupling or electron cyclotron resonance (ECR) excitation, offer reduced plasma particle bombardment energies, but may still cause electrical film damage due to the electrical coupling between the etching substrate features and the plasma. Consequently, alternative techniques for the directional etching and cleaning of electronic materials which occur in an electrically neutral gas-phase environment are needed.

It has been shown that free radicals alone (e.g., F, Cl, H) will etch some semiconductor materials at usable rates, albeit much slower than with the ion-enhanced etching effects of the plasma. Coburn, J., "Dual Atom Beam Studies of Etching and Related Surface Chemistries", *Pure and Appl. Chem.*, Vol. 64, No. 5, pp. 709–713, 1992; and Geis, M., Efremow, N., Pang, S. and Anderson, A., "Hot-jet etching of Pb, GaAs, and Si", *J. Vac. Sci. Technol. B*, Vol 5, No. 1, January/February, 1987. It has also been contended that vibrationally "hot" or excited molecular species (e.g., $SF_6^*$, $Cl_2^*$) also spontaneously etch some semiconductor materials so that full thermal dissociation of the parent gases into free radicals is not required to achieve etching. Saito, Y., Yamaoka, O. and Yoshida, A., "Plasmaless Etching of Silicon Using Chlorine Trifluoride", *J. Vac. Sci. Technol. B*, Vol. 9, No. 5, pp. 2503–2506, September/October, 1991; Chuang, T., "Multiple Photon Excited $SF_6$ Interaction with Silicon Surfaces", *J. Chem. Phys.*, Vol. 74, No. 2, pp. 1453–1460, 1981; Suzuki, K., Hiraoka, S. and Nishimatsu, S., "Anisotropic Etching of Polycrystalline Silicon with a Hot $Cl_2$ Molecular Beam", J. Appl. Phys., Vol. 64, No. 7, pp. 3697–3705, 1988; and Suzuki, K., Ninomiya, K., Nishimatsu, S. and Okada, O., "Si Etching with a Hot $SF_6$ Beam and the Etching Mechanism", *Jpn. J. Appl. Phys.*, 26, pp. 166–173, 1987. However, these species are difficult to generate in large quantities and with good uniformity such that the chemistry may be exploited on the scale of a full-sized wafer, currently 150 mm to 200 mm in diameter. Attempts to generate large quantities of such reactive species outside of the plasma environment have included plasma "downstream" reactors, in which the reactive species are transported from a plasma chamber to a secondary chamber where the material is isolated from the harmful radiative effects of the plasma.

Beams of free radicals and vibrationally hot molecules have been generated in the research environment to investigate their utility as damage-free etchants for electronic materials, where substrate lattice damage is avoided since the particle energies are typically below 10 eV. Vasile, M. and Stevie, F., "Reaction of Atomic Fluorine with Silicon:

The Gas Phase Products", *J.Appl.Phys.*, Vol. 53, No. 5, pp. 3799-3805, May, 1982; U.S. Pat. No. 4,734,152 to Geis et al.; Geis et al. article, supra; and Suzuki et al. article, supra. The use of free radical beams has the advantage that etchant species are delivered to the substrate in a directional manner such that anisotropic or directional etching can be realized. In addition, the beams are transported in a vacuum chamber without substantial gas-phase collisions such that collisional deactivation of the thermally or otherwise activated etchant species does not occur. However, these laboratory scale studies commonly utilize narrowly directed beams created through the use of small capillary tubes or microchannel arrays which provide acceptable etching uniformity over very small substrate areas.

Efforts have been made to introduce directional etching or deposition processes in commercial semiconductor fabrication by attempting to scale-up the laboratory tested molecular beam technology. However, none of these efforts have achieved widespread use in the semiconductor industry which requires good process uniformity over substrate diameters as large as 200 mm, while attaining acceptable wafer throughput. U.S. Pat. No. 4,774,416 to Askary et al. describes a method for employing effusive molecular beam technology for deposition or etching over large substrate areas through the use of a large microchannel plate with thousands of densely packed microscopic channels (100-10,000 per square centimeter) with individual diameters on the order of 10 $\mu$m. The design of laboratory-scale molecular beam sources, particularly those where the gas mean free path $\lambda$ is larger than both the microchannel diameter and length ($\lambda A >> a$, $\lambda \geq L$), has been well documented in the literature. Jones, R., Olander, D. and Kruger, V., "Molecular-Beam Sources Fabricated from Multichannel Arrays. I. Angular Distributions and Peaking Factors", J.Appl.Phys., Vol 40, No 11, pp. 4641-4649, 1969; Glines, A., Carter, R. and Anton, A., "An alternative for gas dosing in ultrahigh vacuum adsorption studies", Rev.Sci.Instrum , Vol. 63, No. 2, pp. 1826-1833, February, 1992. The Askary et al. process involves a scale-up of the earlier laboratory experiments carried out by Jones et al. in 1969. In this gas flow regime, which is often referred to as "transparent", a large percentage of the gas species which flow from a gas reservoir through a microchannel to form the molecular beam do so without gas-to-wall or gas-to-gas interactions inside a microchannel. Therefore, to efficiently produce thermally activated etchant species, the source gas must be thermally or otherwise activated in a furnace or plasma chamber preceding the microarray, or by use of laser beam excitation after exiting the array. However, it is currently not possible to manufacture densely packed microchannel plates in high purity, inert ceramic materials which resist chemical attack by the wide variety of halogen species which are useful in substrate etching and surface cleaning processes. This type of effusive molecular beam technology has found its greatest use in the field of molecular beam epitaxy for the directed delivery of room temperature deposition precursor gases.

The molecular beam source design described in U.S. Pat. No. 5,188,671 to Zinck et al. is an example of the application of the Askary et al. technology for the delivery of deposition precursors. U.S. Pat. No. 4,540,466 to Nishizawa describes a process in which gas is activated by UV light in a high pressure reservoir and flows through an injector plate or gas "shower head" which under some conditions may preferentially orient the gas flow. U.S. Pat. No. 4,886,571 to Suzuki et al. describes a related process by which gas may be thermally activated by contact with an "activation surface" and subsequently directed through the use of a cooled collimator plate to quench the non-directed active gas particles. The operational flow regime and design criteria for the collimator plate are not defined so the extent to which molecular beams are utilized is not explained. Suzuki et al., in U.S. Pat. Nos. 4,901,667 and 5,108,543, further expand on this process and device by defining the gas "activation surface" as a furnace from which the gas flows effusively through a thin aperture plate which under some conditions will act like a cosine emitter. Again, a secondary cooled collimating plate is described for the purpose of deactivating non-directed gas species to improve the directionality of etching. However, the secondary collimating plate reduces gas usage efficiency and, over a wide range of operating conditions, contributes to problems of etching uniformity over large areas. The processes of Askary et al. and Suzuki et al. both suffer the limitations of an effusive beam technology which require high and uniform activated or dissociated particle concentrations to be present in the high pressure furnace or "activating" chamber, as is discussed at length in several proposed furnace designs by Suzuki et al. in U.S. Pat. No. 4,901,667.

It is, therefore, a further object of the present invention to overcome these limitations by achieving activation and formation of the gas beams in the same element, through appropriate usage of the hydrodynamics of collisionally opaque molecular beams where the gas mean free path $\lambda$ is smaller than the dimensions of the beam forming channel over a significant portion of its length. See Gray, D. and Sawin, H., "Design considerations for high-flux collisionally opaque molecular beams", *J.Vac.Sci.Technol.A*, Vol. 10, No. 5, pp. 3229-3238, 1992; Giordmaine, J. and Wang, T., "Molecular Beam Formation By Long Parallel Tubes*", *J.Appl.Phys.*, Vol. 31, No. 3, pp. 463-471, 1960; and Murphy, D., "Wall collisions, angular flux, and pumping requirements in molecular flow through tubes and microchannel arrays", *J.Vac.Sci.Technol.A*, Vol. 7, No. 5, pp. 3075-3091, September/October, 1989.

Nearly all of the earlier work regarding the use of free radical and excited molecular beams in semiconductor manufacture has focused on development of a directional etching process for pattern transfer into thin films through a non-erodible mask. However, the substrate etching rates observed in these processes are often too slow to offer a realistic wafer processing time, and significant mask undercut is often observed. To achieve acceptable manufacturing throughputs, a single wafer etching process must typically achieve 0.1 to 1 micron/min. etching rates with a very high degree of anisotropy (directionality) in pattern transfer. The device shown in U.S. Pat. Nos. 4,901,667 and 5,108,543 to Suzuki et al., for instance, cannot achieve $SF_6$ etching rates of silicon over 500 nm/min. in the regime in which molecular beam formation could occur at realistic pumping speeds. U.S. Pat. No. 5,108,778 to Suzuki et al. describes the use of supersonic nozzles and "seeding" techniques to increase the active particle beam energies above 1 eV to increase etching rates, but this process is not practically scalable to allow etching of large areas with good uniformity. Finally, U.S. Pat. No. 5,110,407 to Ono et al. describes the necessity of using sidewall passivant species such as oxygen or nitrogen radicals during molecular beam etching to prevent the undercut of mask patterns. However, this process is not commensurate with the uniform processing of semiconductor wafers as large as 200 mm. All of these complications and inefficiencies have precluded the use of the previously described molecular beam technologies in the semiconductor wafer manufacturing environment.

It is another object of the present invention to realize an efficient process for the uniform delivery of a directed, thermally activated reactive gas to a large area substrate for material surface cleaning, material removal, or reactive modification in a manufacturing process tool, while overcoming many of the limitations of the above described effusive molecular beam technologies.

SUMMARY OF THE INVENTION

Accordingly, I have invented an apparatus for processing large area substrates, including semiconductor wafers, utilizing a hot neutral gas beam. The apparatus includes a processing chamber having a channel plate positioned therein and dividing the processing chamber into a high pressure reservoir on a first side of the channel plate and a vacuum chamber on a second and opposite side of the channel plate. The apparatus also includes a first gas means for supplying a first parent gas to the high pressure reservoir and a vacuum means connected to the processing chamber for generating a vacuum in the vacuum chamber. A channel plate heating means is provided for heating the channel plate to a desired operating temperature. The channel plate includes a plurality of substantially perpendicular channels therein. Each channel extends from the first side to the second side of the channel plate and the channels are arranged in an array and spaced from each other. The length of each channel is substantially greater than the mean free path of the parent gas in the high pressure reservoir and the diameter of each channel is no smaller than the mean free path of the parent gas in the high pressure reservoir. Control means are included for controlling the pressure in the high pressure reservoir, the temperature of the channel plate and the vacuum in the vacuum chamber such that the parent gas molecules travel through the channels in a collisional flow in an upstream portion of the channels adjacent the high pressure reservoir and become activated through contact with the heated channel plate within the channels. In addition, the control means provides that the activated parent gas molecules travel through a downstream portion of the channels adjacent the vacuum chamber to form a collimated beam wherein substantially no contact with the channel plate occurs. In addition, a transition region between the collisional flow in the upstream channel portion to the collimated flow in the downstream channel portion exists in each channel. The channels have a pressure gradient therein such that the pressure of the activated parent gas exiting the downstream channel portion has a mean free path no less than the length of the channel and substantially larger than the diameter of the channel. A substrate support is positioned within the vacuum chamber, generally aligned with the second side of the channel plate. The substrate support is adapted to support a substrate and is spaced from the channel plate by a distance not substantially greater than the mean free path of the parent gas in the vacuum chamber. The channels in the channel plate are spaced from each other such as to generate a composite of the beams of activated, electrically neutral species of the parent gas directed toward the substrate support.

In a preferred embodiment, the channels in the channel plate are substantially uniformly spaced from each other and generate a substantially uniform composite of the beams of activated, electrically neutral species of the first parent gas. The channel plate heating means can be a continuous resistive trace carried by the channel plate and extending in a serpentine pattern thereabout and an electrical source for passing an electrical current through the resistive trace. The channel plate heating means can also be a source of infrared radiation which is spaced from and irradiates the channel plate. The infrared radiation source is preferably positioned outside of the processing chamber and irradiates the channel plate through an infrared transparent window in the processing chamber. In an alternate embodiment, the channel plate can be formed of a susceptor material and the channel plate heating means is a current carrying coil spaced from the channel plate and generating electromagnetic radiation which induces electrical currents in the channel plate.

The channel plate is formed of an inert, pure, nonmetallic material such as a high purity ceramic material. A ceramic plate can be formed advantageously of boron nitride, silicon carbide, aluminum oxide and graphite.

The apparatus can further include a channel plate support for mounting the channel plate within the processing chamber and means for cooling the channel plate support. Means for controlling the temperature of the substrate support can also be included.

The first parent gas can be a halogen bearing gas, such as $Cl_2$, $HCl$, $ClF_3$, $NF_3$, $SF_6$, $F_2$ and $HF$. The apparatus can further include a second gas means for additionally supplying a second parent gas to the high pressure reservoir, with the first and second parent gasses forming a parent gas mixture in the high pressure reservoir. The second parent gas can include oxygen, nitrogen and hydrogen.

The apparatus can further include an auxiliary gas means for supplying, in an isotropic manner, a background gas to the vacuum chamber. The background gas is preferably selected to improve the directionality of materials removed from a substrate through the formation of passivating sidewall layers and sidewall deposits, or otherwise effecting the substrate surface chemistry.

The apparatus can also include a radiation shield positioned within the vacuum chamber and adjacent and substantially parallel with the second side of the channel plate. The radiation shield includes an array of channels which match the array of channels in the channel plate, but with each radiation shield channel having a slightly larger diameter than each channel plate channel.

The channel plate can, in an alternate embodiment, cover a surface area smaller than that of a substrate positioned therebeneath, and the apparatus would further include a motion means for moving the substrate support to thereby position the entire substrate surface beneath the channel plate. The motion means is advantageously a rotation means for rotating the substrate support about a central axis extending perpendicular to the opposite side of the channel plate. The channel plate can also be segmented into at least two separate segments, with each segment defining a separate gas reservoir having associated therewith its own gas means for supplying particular parent gas to each gas reservoir. If a segmented channel plate is used, then the apparatus would include motion means for moving the substrate support as described above.

The apparatus can further include an ultraviolet laser generating an ultraviolet laser beam and raster means for raster scanning the laser beam across the surface of the substrate to facilitate surface chemical reactions, substrate heating and particle removing during processing.

The pressure in the high pressure reservoir can be between about 0.01 torr and about 10 torr, the diameter of each channel in the channel plate can be between about 0.1 mm and about 0.5 mm, the aspect ratio (length/diameter) of each channel in the channel plate can be between about 5 and about 20, and the channel density in each channel plate can be between about $0.1/cm^2$ and about $10/cm^2$.

DESCRIPTION OF THE PREFERRED EMBODIMENTS

Figure 1:
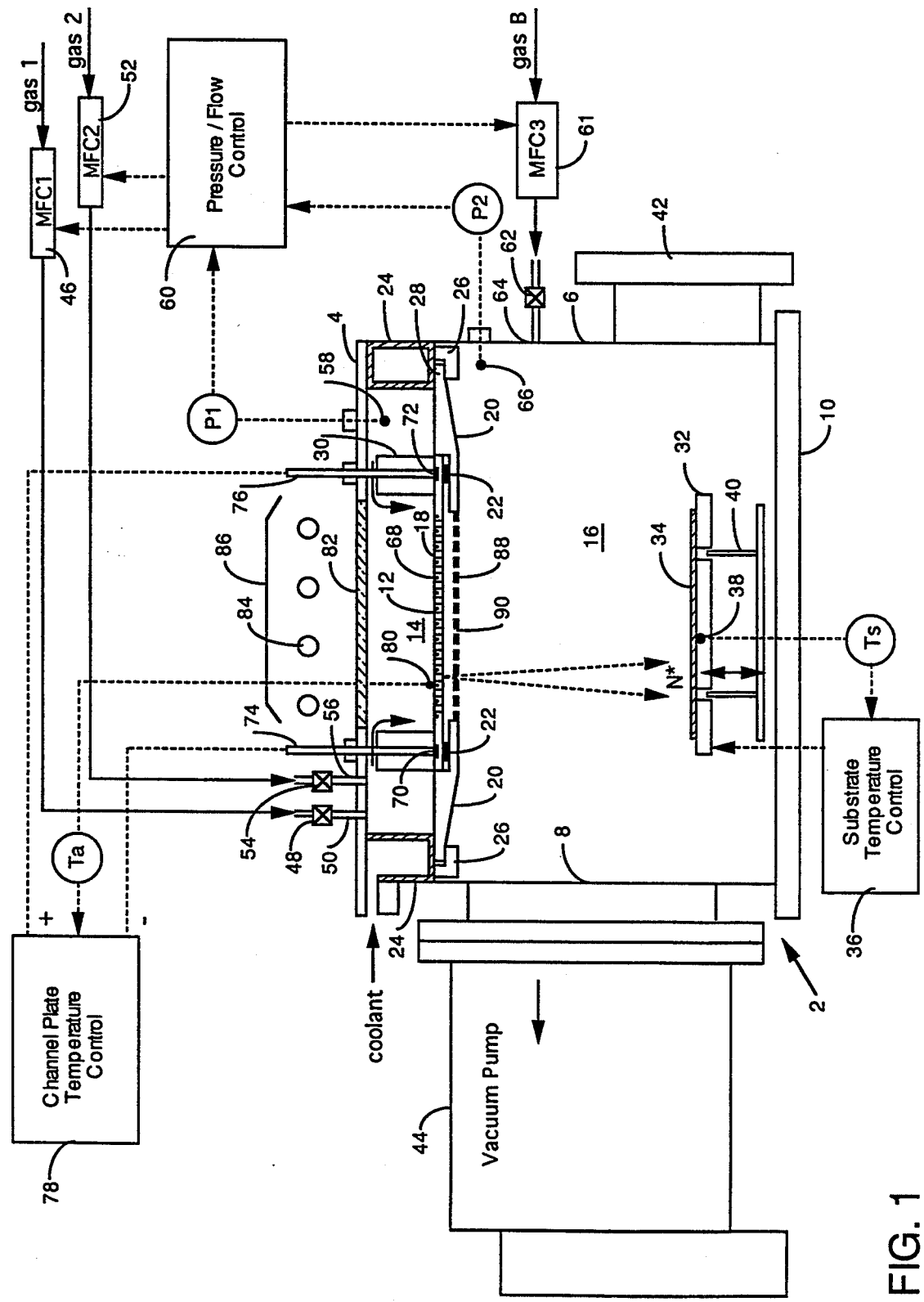
FIG. 1 is a schematic diagram of one embodiment of a hot neutral gas beam processing system in accordance with the present invention.

A schematic diagram showing one embodiment of a surface cleaning and conditioning apparatus using a hot neutral gas beam array is shown in FIG. 1. As will be explained hereinafter in more detail, this apparatus is particularly adapted for processing large area substrates, particularly semiconductor wafers. As shown in FIG. 1, the apparatus includes a processing chamber 2 including a top 4, sidewalls 6 and 8, and bottom 10. A channel plate 12 is positioned therein and divides the processing chamber 2 into a high pressure reservoir 14 on an upper side of the channel plate 12 and a vacuum chamber 16 on a lower and opposite side of the channel plate 12. As will be explained hereinafter in more detail, the channel plate 12 includes a plurality of substantially perpendicular channels or holes 18 therein which extend through the channel plate 12 from its upper side to its lower side. The channels 18 are arranged in an array and are preferably substantially uniformly spaced from each other. The channels 18 permit gas to flow through the channel plate 12 from the high pressure reservoir 14 to the vacuum chamber 16.

A support ring 20, supported by the sidewalls 6, 8 of the processing chamber 2, support the channel plate 12, and the channel plate 12 and support ring 20 may be separated by a gasket ring 22 therebetween. The support ring 20 can be attached to the sidewalls 6, 8 of the processing chamber 2 by a cooled mounting ring 24 and a clamp 26 engaging an outer edge 28 of the support ring 20 and allowing for thermal expansion of the support ring 20. A coolant, such as water or the like, is continuously circulated through the mounting ring 24 in order to draw heat from the support ring 20. A cylindrical retaining ring 30 can be positioned on the upper surface of the channel plate 12 and surrounding the array of channels 18. The retaining ring 30 can either be pressed against the channel plate 12 from an upper portion of the processing chamber 2 or may be bolted thereto through the support ring 20. The retaining ring 30 is used to apply pressure to the channel plate 12 to prevent the channel plate 12 from warping and also to act as a radiation shield to the cooled mounting ring 24 spaced from and surrounding the retaining ring 30.

A substrate support 32, such as a susceptor plate, is positioned within the vacuum chamber 16, typically near the bottom 10 of the processing chamber 2. The substrate support 32 is generally aligned with the lower side of the channel plate 12 and is adapted to support a substrate 34 thereon. As will be explained hereinafter in more detail, the upper surface of the substrate support 32, which supports the substrate 34, is spaced from the lower side of the channel plate 12 by a particularly optimum distance. The substrate support 32 can be heated and/or cooled by a substrate temperature control 36 and the temperature of the substrate support 32 is monitored by temperature sensor 38 which supplies control signal $T_S$ to the substrate temperature control 36. Heating of the substrate 34 through the substrate support 32 can include resistive or infrared heating and the substrate 34 may be clamped thereto by mechanical or electrostatic means. Heating of the substrate 34 is necessary not only to control its temperature during the gas beam etching process, but also to allow rapid thermal heating after processing to volatize and remove contaminants and corrosive compounds. Cooling of the substrate 34 may be preferred for some processes. A substrate lift 40 can be included to lift the substrate 34 from the substrate support 32 and into a position from which the substrate 34 may be removed by robotic means or the like through a standard MESC interface port 42 through sidewall 8 of the processing chamber 2 and in communication with the vacuum chamber 16.

A vacuum pump 44 or other mechanism for drawing a vacuum is connected through sidewall 8 to the processing chamber 2 and draws a vacuum in the vacuum chamber 16. One or more parent gas species are supplied to the high pressure reservoir 14 above the channel plate 12 and within the processing chamber 2. As shown in FIG. 1, two such parent gas species are supplied thereto. A first parent gas is supplied through a first mass flow controller 46, through valve 48, through inlet port 50 extending through the top 4 of the processing chamber 2 and into the high pressure reservoir 14. Similarly, a second parent gas is supplied through a second mass flow controller 52, valve 54 and inlet port 56 and into the high pressure reservoir 14. Pressure transducer 58 in the high pressure reservoir 14 measures the pressure therein and supplies control signal $P_1$ to a pressure and flow control 60 which, through control of the first and second mass flow controllers 46 and 52, controls the flow of the parent gases into the high pressure reservoir 14. As an option, an auxiliary or background gas can be supplied through a third mass flow controller 61, valve 62 and inlet port 64 in sidewall 6 to the vacuum chamber 16. The third mass flow controller 61 is also under the control of the pressure and flow control 60. This background gas is introduced in an isotropic manner where it does not impinge upon the substrate 34 as a directed beam. The use of a background gas allows the adsorption of deposition of passivants or catalysts on the surface of the substrate 34, or the pre-conditioning of the substrate with an HF acid vapor to remove native oxide layers. Pressure transducer 66 in the vacuum chamber 16 measures the pressure therein and supplies control signal $P_2$ to the pressure and flow control 60.

In accordance with this invention, the channel plate 12 is heated in some manner in order to activate the parent gas molecules passing therethrough and along the channels 18 from the high pressure reservoir 14 to the vacuum chamber 16, with the activation resulting from contact between the gas molecules and the channel plate 12, or with other activated gas molecules. The heating of the channel plate 12 can take place in a number of different ways. In the embodiment shown in FIG. 1, a resistive trace 68 passes through the channel plate 12 in a serpentine pattern and about the channels 18. Contact pads 70 and 72 are provided at opposite sides of the channel plate 12 and at the ends of the resistive trace 68. Electric power electrodes 74 and 76 extend through the top 4 of the processing chamber 2 and the retaining ring 30 to contact pads 70 and 72, respectively. Electrical power is supplied from a channel plate temperature control 78 to the power electrodes 74 and 76 and, thereby, pass electrical current through the resistive trace 68 in the channel plate 12. Temperature sensor 80 monitors the temperature of the channel plate 12 and supplies control signal $T_a$ to the channel plate temperature control 78 which helps to regulate the channel plate 12 to a desired operating temperature.

If a resistive heating arrangement is used for the channel plate 12, then the portion of the top 4 of the processing chamber 2 above the channel plate 12 is formed of a reflective material to minimize radiated heat losses to the surrounding area. In an alternate embodiment, the resistive trace 68 and contact pads 70, 72 in the channel plate 12 are removed, and the reflective material in the top 4 of the processing chamber 2 is replaced with an infrared transmissive window, such as a quartz window 82. A plurality of infrared lamps 84 are positioned outside of the processing chamber 2 and above the quartz window 82. The infrared radiation from the infrared lamps 84 is directed, by means of a reflective shield 86, to the channel plate 12 to thereby heat the channel plate 12 to a desired operating temperature. In another embodiment, the infrared lamps 84 are replaced by one more current carrying coils, such as pancake-type coil windings, and the channel plate 12 is constructed of a susceptor material such that electromagnetic radiation from the current carrying coils induces electrical currents in the channel plate 12. Such a material could include a silicon-carbide coated graphite to allow uniform inductive heating. In this arrangement, the quartz window 82 would be replaced by a non-conducting vacuum window, such as an alumina or boron nitride window, to allow the transmission of electromagnetic fields.

A radiation shield 88 can be positioned within the vacuum chamber 16 and adjacent and substantially parallel to the lower side of the channel plate 12. The radiation shield 88 includes an array of channels 90 which match the array of channels 18 in the channel plate 12, but each channel 90 in the radiation shield has a slightly larger diameter than the diameter of a corresponding channel 18 of the channel plate 12. This radiation shield 88 is formed of a material having sufficient reflectivity to prevent the substantial radiative heating of the substrate 34 or of other internal surfaces from the channel plate 12.

The individual channel dimensions in the heated channel plate 12 are such that the gas flow regime on the high pressure reservoir 14 side of the channel plate 12 is collisional and substantially all the parent gas molecules contact a hot channel 18 sidewall and/or another thermally hot or activated particle inside the channels 18. Contact of the parent gas or gases with the hot channel 18 sidewall causes molecular dissociation or thermal activation of the parent gas to a state, identified as N* in FIG. 1, which is substantially more reactive with the substrate 34. Thermal activation of the parent gas may include the thermal dissociation of the gas, for example, $ClF_3$, into chlorine and fluorine atoms, as well as the production of vibrationally or otherwise internally "hot" $ClF_3^*$ gas molecules. However, no substantial concentration of charged particles, such as ions or electrons, are produced as in the case of plasma activation. Due to the large reactivity of the activated gas N*, materials of construction in the processing chamber 2 must resist corrosion and offer a contamination free environment for electronic materials processing.

In a preferred embodiment, the support ring 20 is constructed of a ceramic material of low thermal conductivity and good thermal shock resistance, such as alumina or silicon carbide. The gasket ring 22 separating the channel plate 12 and the support ring 20 may be formed of graphite, boron nitride, or other relatively soft and chemically inert material. All materials of construction used in the channel plate 12 and the support ring 20 assembly must be of sufficiently high purity for use in semiconductor process equipment, and must not degrade in corrosive gaseous environments at temperatures up to 1,500° C. Acceptable materials include, but are not limited to, alumina, silicon carbide, graphite, boron nitride, quartz, machinable glass ceramics, and composites thereof or of similarly pure, inert materials. The main processing chamber 2 and internal components which may be maintained at temperatures up to 500° C., are preferably constructed of aluminum which is anodized to form a very dense and hard aluminum oxide coating. The channel plate 12, gasket ring 22 and support ring 20 should be maintained in close contact as to form a seal to prevent significant gas flow from the high pressure reservoir 14 to the vacuum chamber 16 around the edge of the channel plate 12. As a rule of thumb, this edge gas flow rate should be less than 10% of the total gas flow rate through the channel plate 12.

Figure 2:
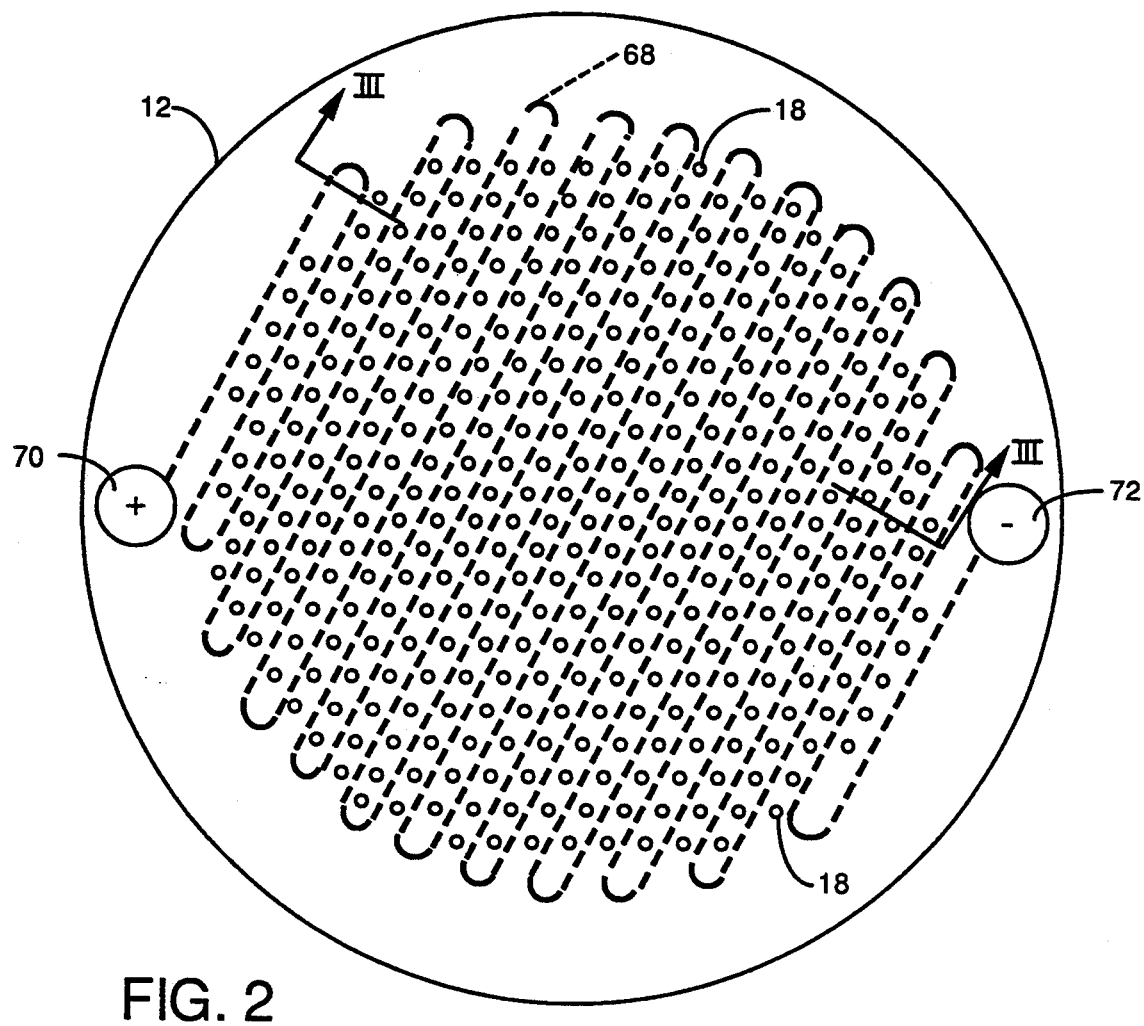
FIG. 2 is a top plan view of one embodiment of a channel plate which can be used with the present invention.
Figure 3:
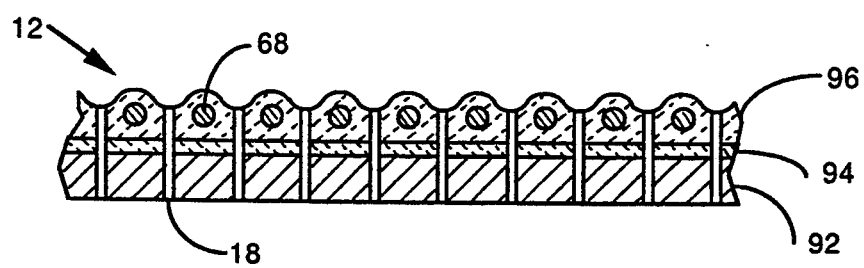
FIG. 3 is a section taken along lines III—III in FIG. 2.

The resistive heated channel plate 12 in accordance with the present invention is shown in more detail in FIGS. 2 and 3. The channel plate 12 is a plate of an appropriate thickness and having an array of channels or holes 18 machined therethrough in a central portion. The shape of the array shown in FIG. 2 is a geometrically regular array, here a triangular array, and the channel spacing and diameters chosen depends on the desired beam divergent properties. However, a 1 cm channel spacing is typical. Contact pads 70 and 72 are positioned in a smooth outer ring of the channel plate 12 surrounding the array or hole area. The resistive trace 68 extends from contact pad 70 at one end in a serpentine pattern winding around and between each of the channel holes 18 in the pattern shown in FIG. 2 to contact pad 72 at the other end. In an alternative arrangement, the resistive trace 68 is a flat ribbon trace and the channel holes 18 are formed both through the trace and through the non-trace areas of the channel plate 12. The channel plate is formed of a ceramic base 92 and is covered with an electrical isolation layer 94 and a cap layer 96 through which the resistive trace 68 extends. The resistive trace 68 can be formed of wire, graphite or other conductive materials. The electrical isolation layer 94 and the cap layer 96 can be formed of boron nitride or other appropriate insulating materials. It is typically desirable to have a channel length/diameter or aspect ratio on the order of 10, which is set through the appropriate choice of plate thicknesses of typically 3–10 mm, and channel diameters of typically 0.1–0.5 mm. Aspect ratios of 5–20 have been found to be useful in the present invention. The density of the channels 18 in the channel plate 12 can range from about $0.1/cm^2$ to about $10/cm^2$.

Figure 4:
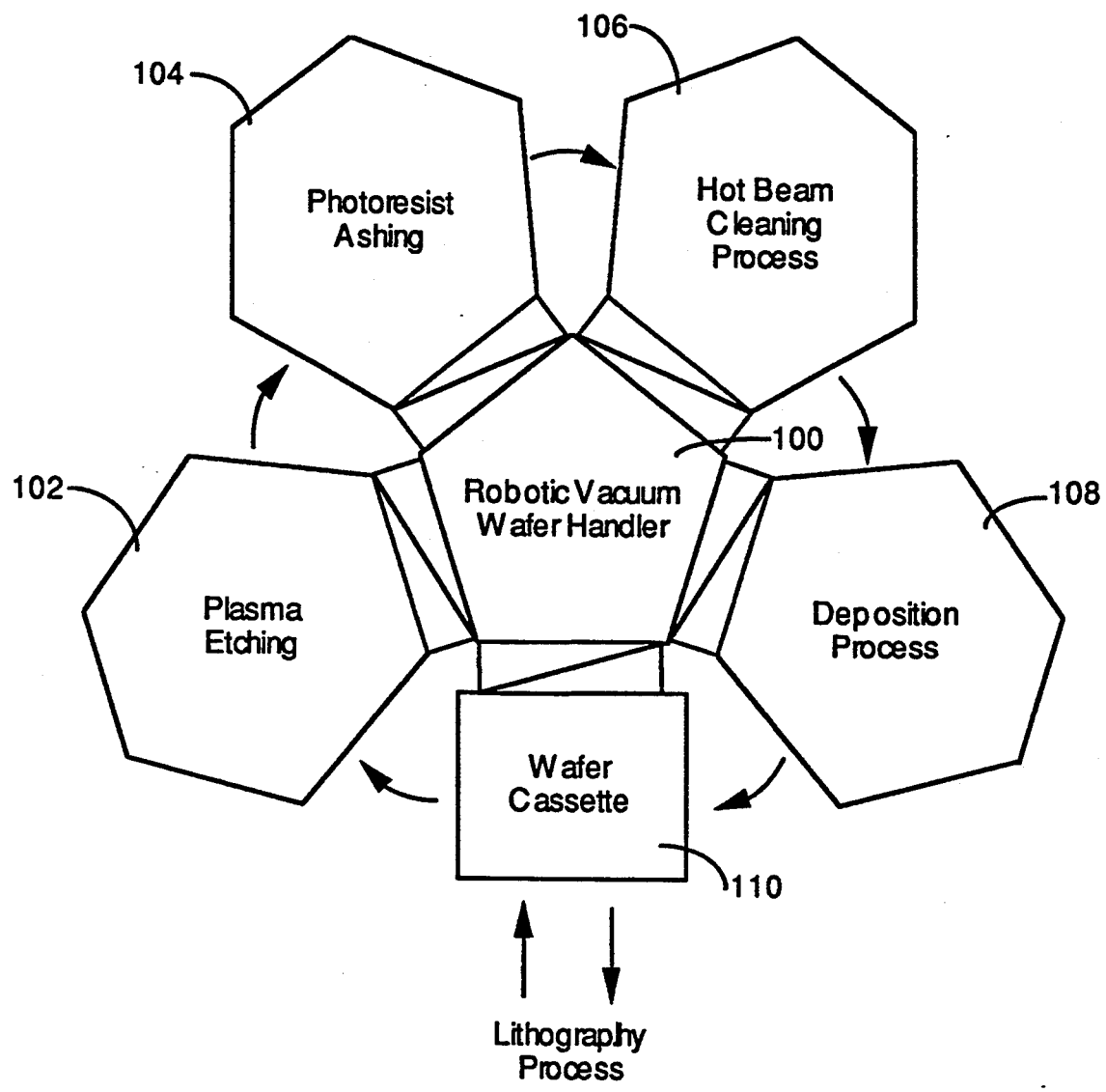
FIG. 4 is a schematic diagram of a clustered process tool utilizing the hot neutral gas beam processing system of the present invention.

It may be advantageous to include the present invention in a vacuum cluster process system which includes a robotic vacuum handler in which all the processing steps take place without breaking the vacuum. One embodiment of such an arrangement is shown in schematic view in FIG. 4. The central portion of this arrangement is the robotic vacuum wafer handler 100. In one proposed system, surrounding the handler 100 are stations for plasma etching 102, photoresist ashing 104, the hot beam cleaning process 106 of the present invention, and a subsequent deposition process 108. After wafer cassette 110 is loaded into the cluster system after a lithography process, it undergoes the process flow indicated in FIG. 4.

Although efficient design of the channel plate 12 and sufficient speed from the vacuum pump 44 will provide acceptable processing uniformity over a large substrate area, rotation of the substrate 34 may be preferred in order to reduce the number of required channels and required pumping speeds. An alternate embodiment of the present invention, which utilizes rotation of the substrate 34 for processing uniformity, is shown schematically in FIG. 5. This embodiment includes many of the features shown in FIG. 1 and, accordingly, like reference numbers will be used to identify like elements. In this embodiment, the channel plate 12 produces hot gas beams over a fraction of the substrate surface. The substrate support 32 is connected along a central axis thereof to a rotating shaft 120 which is driven by a substrate rotation driver 122. By rotating the substrate support 32 appropriately, the substrate 34 positioned thereon will have its entire surface exposed at one time or another to the hot gas beam generated from the channel plate 12. This embodiment allows a reduction of the total number of channels 18 in the heated channel plate 12 through which the hot gas beams are flowing, thus reducing the total parent gas load in the processing chamber 2. The area over the substrate 34 which is not directly exposed to hot gas beams is open to allow efficient pumping by the vacuum pump 44. In this manner, large area substrates 34 may be processed while reducing overall vacuum pumping speed requirements, albeit at the expense of substrate throughput rates.

Figure 5:
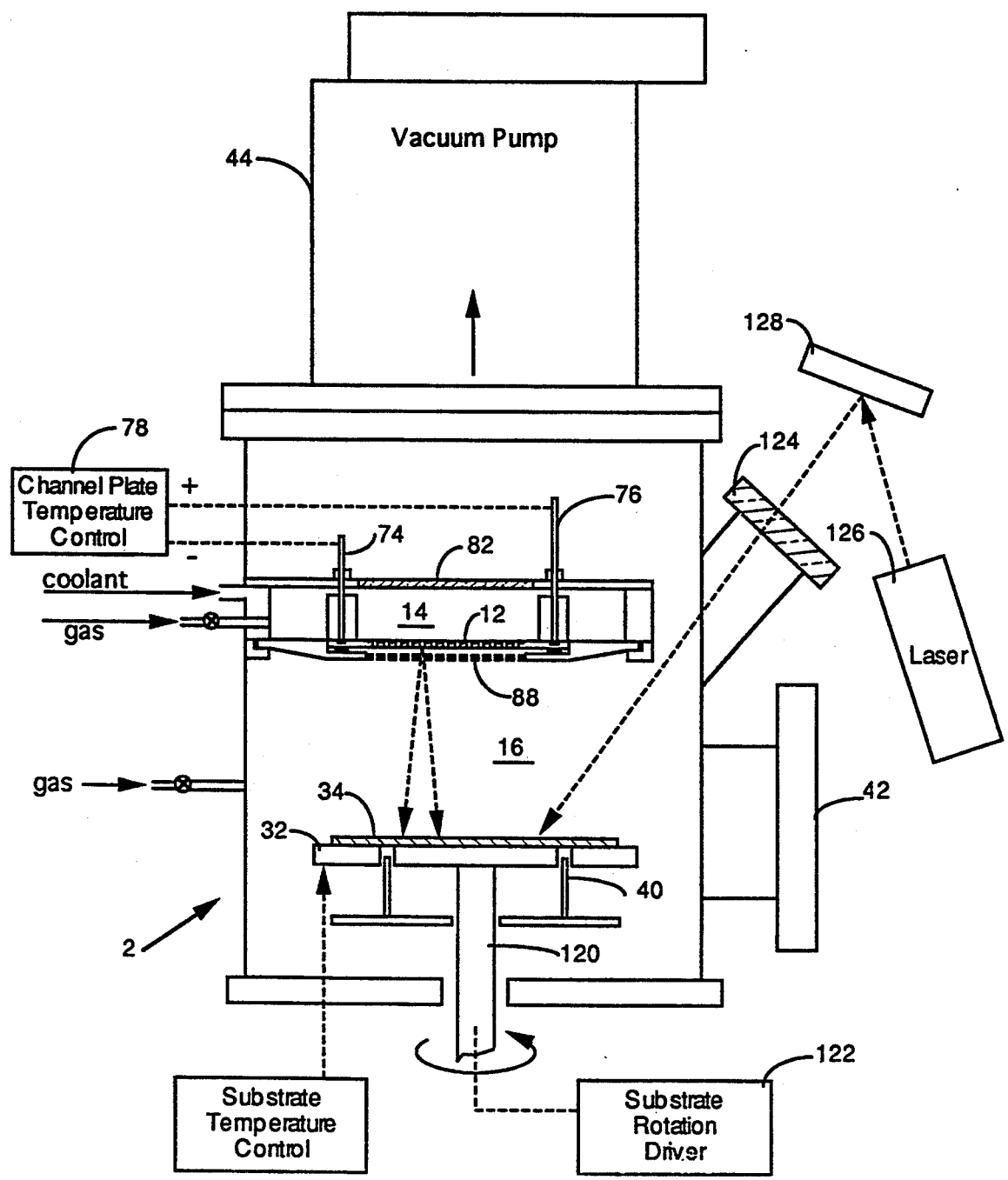
FIG. 5 is a schematic diagram of another embodiment of a hot neutral gas beam processing system in accordance with the present invention.

The embodiment shown in FIG. 5 also includes an optical port 124 through the processing chamber 2 and connected to the vacuum chamber 16 which allows access of a pulsed UV laser beam. A UV laser 126 directs its output beam to a steering mirror 128 which can be used to raster scan the UV laser beam across the surface of the rotating substrate 34. The UV laser beam may facilitate surface chemical reactions, substrate heating and removal of particles and reaction residues.

Figure 6:
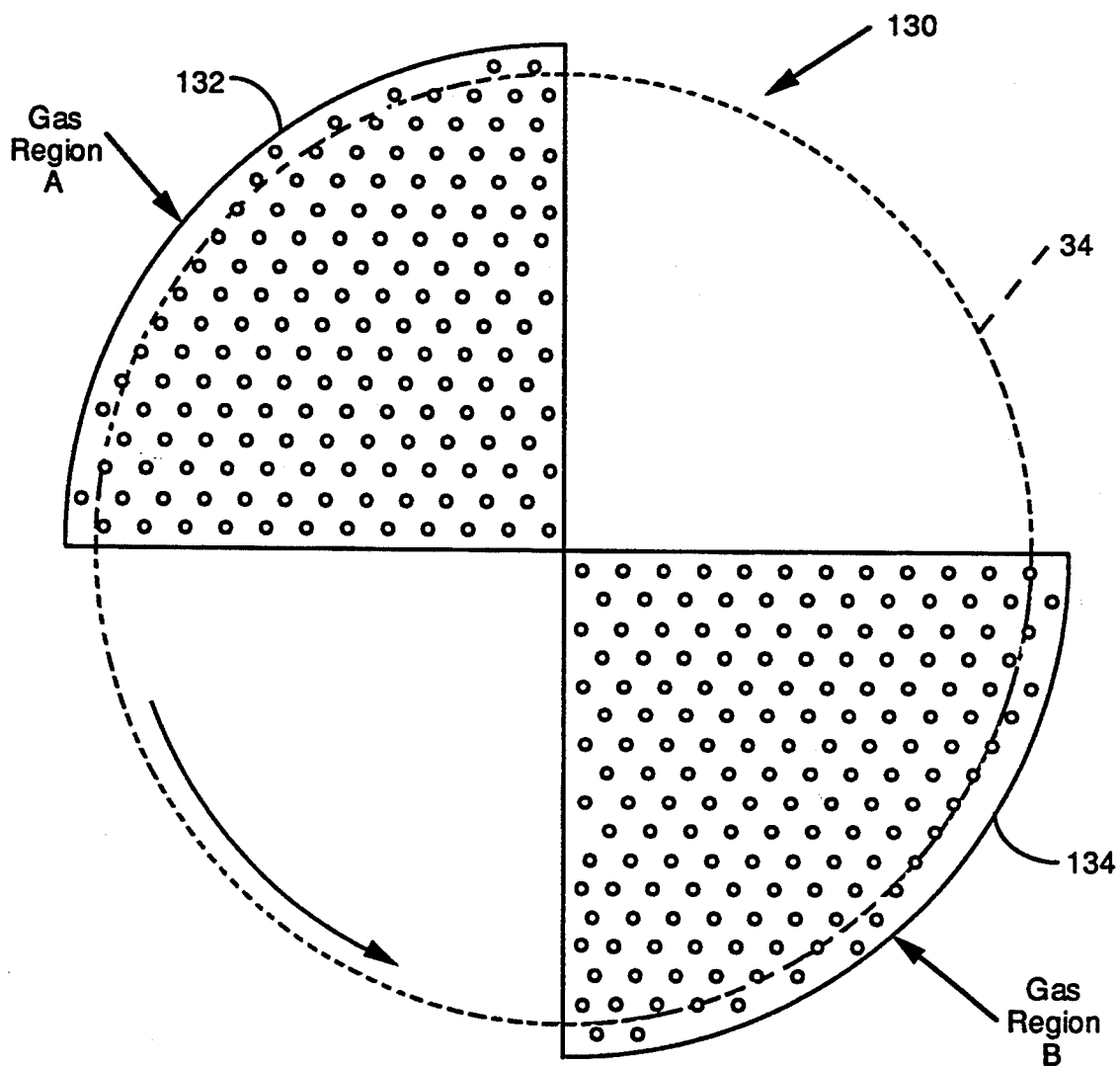
FIG. 6 is a top plan view of another embodiment of a channel plate which can be used with the present invention.

A variation of the channel plate 130 which divides the channel array into two or more multiple sections is shown in FIG. 6. In this embodiment, a first 90° segment 132 of the channel plate 130 is connected to and defines a first gas reservoir including a first parent gas, identified as gas region A in FIG. 6. A second 90° segment 134 of the channel plate 130 is connected to and defines a second gas reservoir, including a second parent gas, identified as gas region B in FIG. 6. The circular substrate 34 positioned therebeneath, shown in dotted lines in FIG. 6, can be rotated beneath the plurality of gas regions as discussed above. By exposing the underlying substrate 34 to two or more distinct regions of hot gas beams, the catalytic effect of dual atom chemistries can be utilized.

In the embodiments shown in FIGS. 5 and 6, it may prove advantageous to space the channel holes 18 in a non-uniform manner to compensate for the varying amount of time that different areas of the substrate 34 remain under the channel plate 12. For example, the channel holes 18 in FIG. 6 may become gradually more dense as one travels from the center toward the wider, outer areas of the channel plate segments 132 and 134.

Details of the heated channel plate and the hydrodynamics of the activated gas beam formation are described with reference to FIG. 7. The channel plate 12 of thickness, L, is fabricated to support an array of sufficiently small channels 18 of characteristic diameter, a, where the channel aspect ratio is given by $L/a$. The channel plate 12 is heated, such as by resistive trace 68, to a desired temperature, typically in the range of 700° to 1,500° C. Cylindrical channels of over 100 μm may be formed using conventional or ultrasonic drilling technology. Smaller channels may be formed by other means and may have cross sections other than circular, although it is typically optimal for the cross section to be uniform and smooth. The efficient heating of the parent gas and directionality of the beams is determined by the aspect ratio of the channels, $L/a$, the driving pressure across the channels and, to a lesser extent the shape of the channels, the material type, and the surface morphology in the channels. For straight cylindrical channels, efficient heating of the gas species and the directionality of the beam involve a trade off, and are governed by the ratio $\eta$ of the channel diameter to the average gas mean free path $\lambda_v$ in the channel downstream region (on the vacuum side). Physically this means that collimation of the gas beam occurs only over that length near the vacuum side of the channel, after a transition point 136, where gas phase collisions no longer significantly occur. Since the parent gas or high pressure reservoir supplies the parent gas at relatively high pressures between about 0.01 torr and about 10 torr, typically about 1 torr, the gas flow on the high pressure reservoir or upstream side of the channel is collisional in nature since the gas density is large enough to represent a continuum. On the reservoir side of the channel we have the mathematic requirement:

$$\lambda_r < < L \text{ and } \lambda_r \leq a \text{ (reservoir entrance of channel)} \quad (1)$$

where $\lambda_r$, the gas mean free path at the reservoir side of the channel, is determined by the reservoir side pressure P and gas temperature T according to simple kinetic gas theory where k is the Boltzman constant and $\sigma$ is the gas collision diameter:

$$\lambda = (\sqrt{2}\pi\sigma^2(P/kT))^{-1} \quad (2)$$

The flow in the upstream end of the channel is termed collisionally opaque since substantially no gas molecules can flow directly from the gas reservoir to the vacuum side of the channel plate without collisions with other molecules and/or the hot channel walls. Because of the high collisionality of the upstream channel region nearly all parent gas species have been thermally activated prior to exiting the channel. The activated gas molecules are shown as dark circles in FIG. 7 while the unactivated gas molecules are shown as open circles. In some instances, it may be desirable to further increase the gas density in the channel by adding a restricting orifice 138 on the vacuum side of the channel. The purpose of this restricting orifice 138 is not to form supersonic gas "jets", but merely to increase the gas activation efficiency in the channel. In cases where the channel plate is fabricated in an extremely hard material such as alumina, the main channel diameter may be fabricated by conventional or ultrasonic drilling technologies, while the restricting orifice 138 is created using laser drilling.

Due to the large pressure gradient across the channel, the gas density in the channel decreases toward the vacuum side of the chamber and a transition from collisional gas flow to Knudsen type gas flow occurs at transition point 136. On the vacuum side of the channel we have the requirement that the mean free path is large compared to the channel dimensions:

$$\lambda_v \geq L \text{ and } \lambda_v > > a \text{ (vacuum side of channel)} \quad (3)$$

The distance $\Lambda$ from the transition region to the channel exit is the length scale over which useful gas collimation and beam formation occur. The value of $\Lambda$ may be estimated as $$\Lambda \approx \frac{0.858 \sqrt{va^3}}{\sigma \sqrt{N_{tot}}} \quad (4)$$

where $\sigma$ is the gas phase collision diameter, v is the average gas mean speed, and $N_{tot}$ is the gas flow through one channel. The gas mean speed is related to the gas temperature and molecular mass by the equation:

$$v \approx \sqrt{\frac{8k_bT}{\pi m}} \quad (5)$$

For example, with 1200K $Cl_2$ gas flow at $5 \times 10^{16}$ mols/sec. in a tube of 250 μm radius, the transition length $\Lambda$ is on the order of 1 mm, so if the total channel length is 5 mm, the gas flow regime is collisional for most of its residence time in the channel during which it is effectively heated by the hot channel walls. As the driving pressure behind the channel is reduced, the total flow rate $N_{tot}$ through the channel is decreased and both the value of $\Lambda$ and the beam directionality subsequently increase.

To design for the occurrence of this flow transition point somewhere in the channel, we can follow the approximate mathematical criterion that:

$$\Lambda \geq a/2 \text{ and } \Lambda \leq L \quad (6)$$

Figure 7:
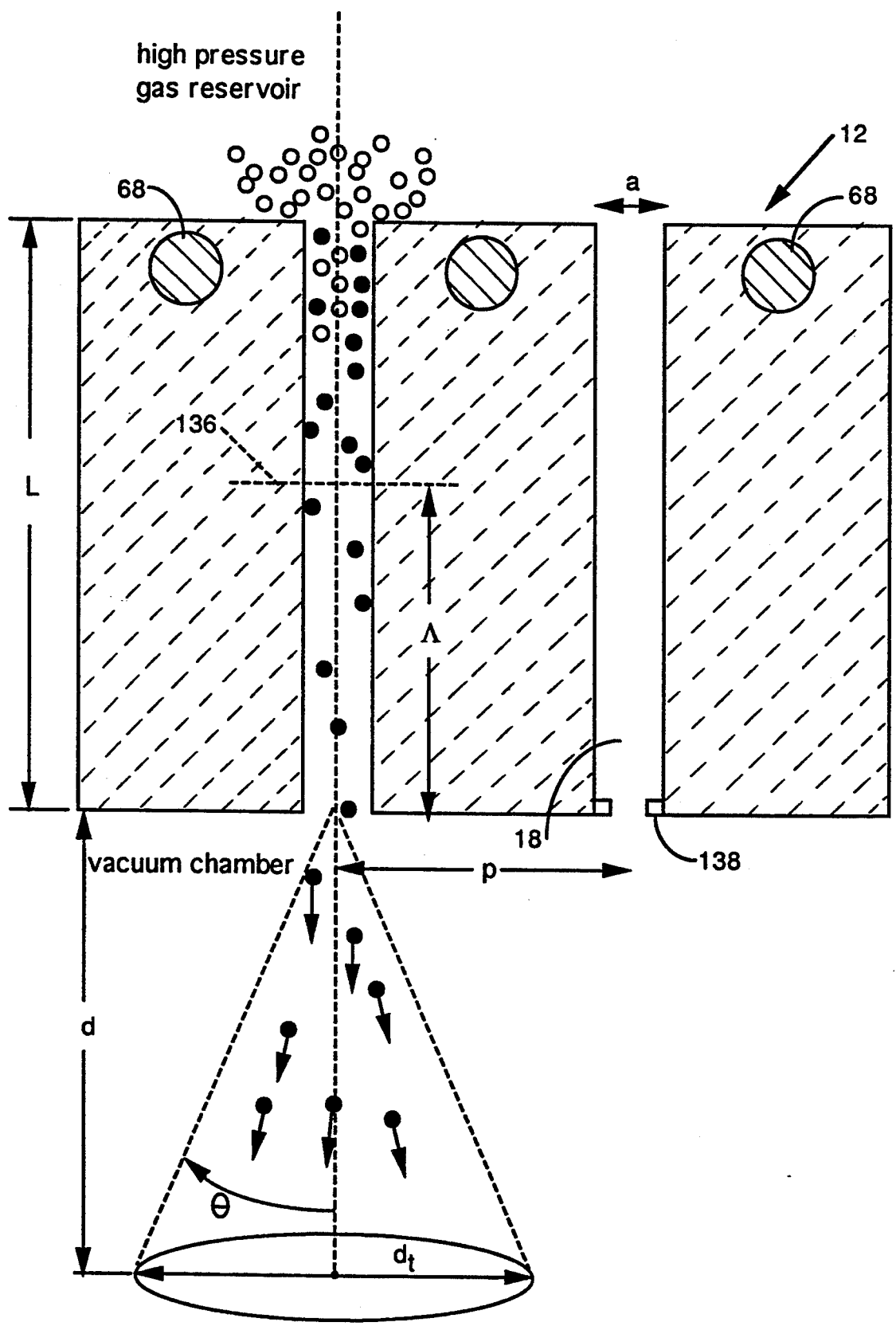
FIG. 7 is a schematic diagram illustrating the flow and collisional heating of a parent gas through a channel of the channel plate shown in FIGS. 2 and 3 and from a high pressure gas reservoir to a vacuum chamber separated from each other by the channel plate.

A beam divergence may be defined, which in reference to FIG. 7, is the included angle which when rotated about the beam axis forms a cone which contains the substantial proportion of the directed gas flux. In general, the divergence of a single beam is related to the channel dimensions by the equation:

$$\delta \propto \tan^{-1}\frac{a}{\Lambda} \quad (7)$$

Since the value of $\Lambda$ may be varied by adjusting the driving pressure behind the array, the directionality of the beam source may be tuned over a wide range to create a more directional source for anisotropic etching of deep substrate features or a more isotropic source for the cleaning of feature sidewalls. In a well-designed channel array plate, the pitch spacing p of the individual channels must be chosen such that the individual intensity variations of the beamlets formed at the channel plate are smoothed out when the integrated beam flux over the entire array impinges upon the substrate sample at some optimal distance from the array. This being the case, the divergence characteristics of the entire channel array $\Delta$ are related to the channel pitch spacing p and the channel array-to-substrate distance d by the equation:

$$\Delta \propto \tan^{-1}\frac{p}{d} \quad (8)$$

In order to accurately predict the angular divergence of the individual gas beams for array design purposes, the parameter $\eta$ may be estimated using the results of kinetic theory as:

$$\eta = \frac{a}{\lambda_v} = \frac{\sqrt{2}\pi\sigma^2 aP_v}{k_bT} = \frac{4\sqrt{2}\sigma^2 N_{tot}}{av} \quad (9)$$

where $P_v$ is the pressure on the vacuum or exit side of the channel. The angular distribution function of the single beams may be approximated using extensions of the first order theory of Giordmaine and Wang:

$$I(\theta) \approx a\sqrt{N_{tot}}\cos^{3/2}(\theta)\int_0^1 (1-\zeta^2)^{1/2} erf(2 k \zeta) d\zeta, \quad (10)$$

$$a = \frac{0.148\sqrt{\left(\frac{a}{2}\right)v\pi}}{2\sigma}, \quad (11)$$

-continued $$\zeta = \frac{z \tan(\theta)}{a}, \quad (12)$$

$$k = \frac{1}{\tan\theta} \left[ \frac{3\eta}{2\cos\theta} \right]^{1/2}, \quad (13)$$

and $$r = \frac{d(n)}{d(z)}, \quad (14)$$

where z is the tube length coordinate, n is the gas molecular density and r is the axial gas density gradient. In order to transform this distribution into the dimensionless form, $J(\theta)$, required for integration in equation (10), it is necessary to perform the integral normalization of the distribution in the form:

$$J(\theta) = \frac{I(\theta)}{\beta} \quad (15)$$

where $$\beta = 2\pi \int_0^{\pi/2} I(\theta) \sin(\theta) \, d(\theta) \quad (16)$$

Calculation of these distributions requires knowledge of the molecular density profile in the tubes as well as physical gas constants and geometric parameters. The density gradient, r, after the transition from collisional or viscous flow to Knudsen or collimated flow may be estimated by the first-order approximation:

$$r = \frac{3 N_{tot}}{2 \pi v \left(\frac{a}{2}\right)^3} \quad (17)$$

Equations (10) to (17) are employed to calculate the gas flux intensity distribution for one channel $I(\theta)$ over a substrate target area $A_t$, with target diameter $d_t$, at a distance d away from the channel plate (with reference to FIG. 7) where $\theta$ is the polar coordinate:

$$A_t = \frac{\pi d_t^2}{4} \quad (18)$$

$$\theta = \text{TAN}^{-1}(d_t/2d) \quad (19)$$

Figure 8:
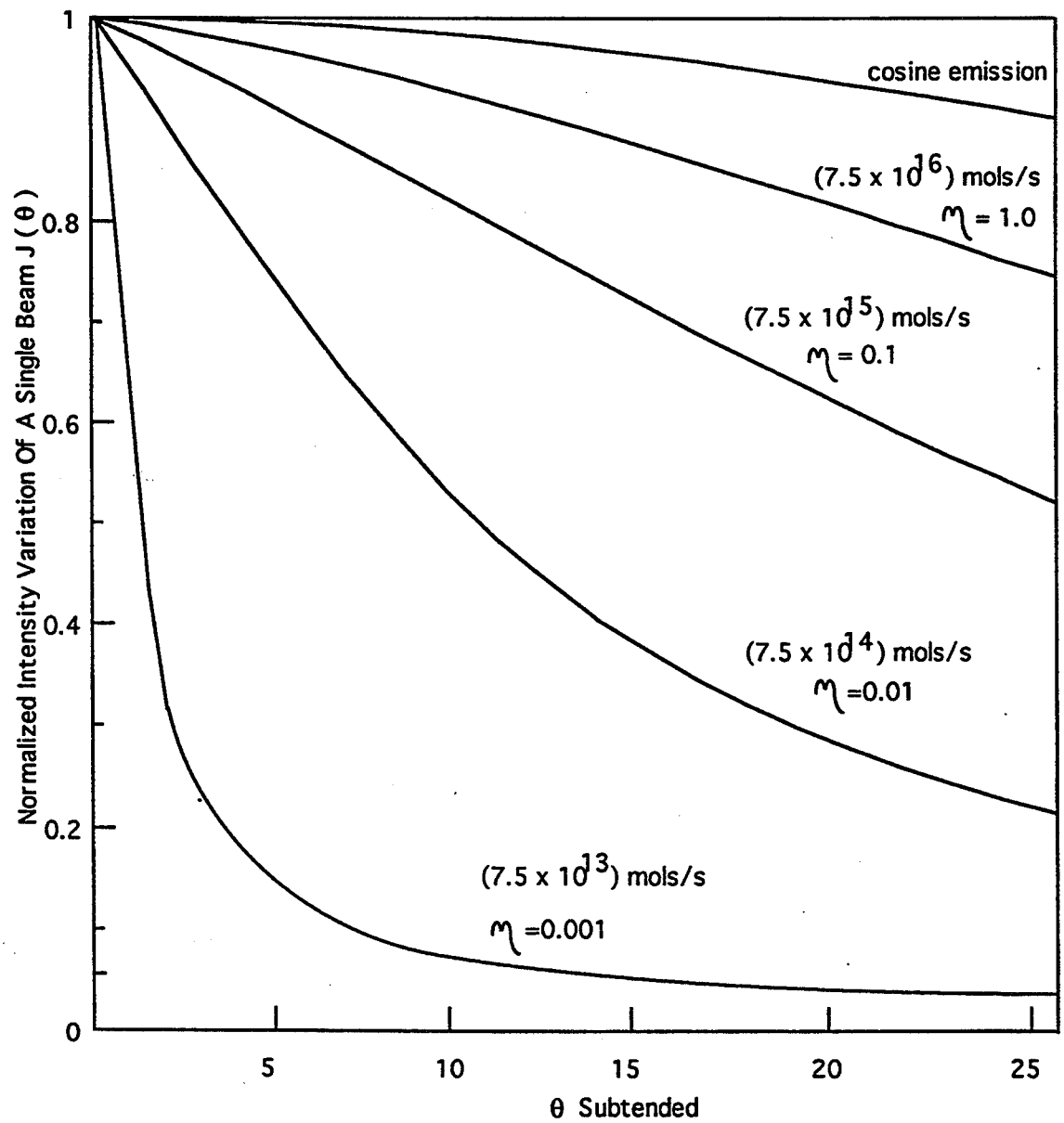
FIG. 8 is a graph of beam directionality as a function of the parameter $\eta$.

The variation in the directionality of a single gas beam as a function of $\eta$ as predicted from the integration above is shown in FIG. 8 for a point source. The corresponding $Cl_2$ gas flow rates through a 250 μm diameter channel with a 10:1 aspect ratio are also shown for reference. Note that the gas beam becomes much less directed and well defined as $\eta$ and the total gas flow rate through the channel increase.

The pitch spacing and channel plate-to-wafer spacing design criteria are set by restrictions of uniformity of the composite gas beam (the sum of all the individual gas beams) to the wafer surface. What is typically required is that the variation or "ripple" in the composite gas flux intensity distribution to the wafer surface be less than 10% of the mean gas flux intensity distribution at the wafer. The composite gas flux intensity distribution $\Sigma I(\theta)$ is obtained by summing the individual beam intensities $I(\theta)$ over the entire substrate surface at a distance d from the channel plate. The design criterion for uniformity is that the variation in $\Sigma I(\theta)$ from point to point on the wafer be less than 10% of the mean gas flux intensity distribution $\Sigma I(\theta)$. If the uniformity at the wafer is not adequate, either the channels in the array can be placed closer together or the wafer can be moved further from the channel plate. Either of these actions has the same effect on composite gas beam uniformity over the wafer.

Figure 9:
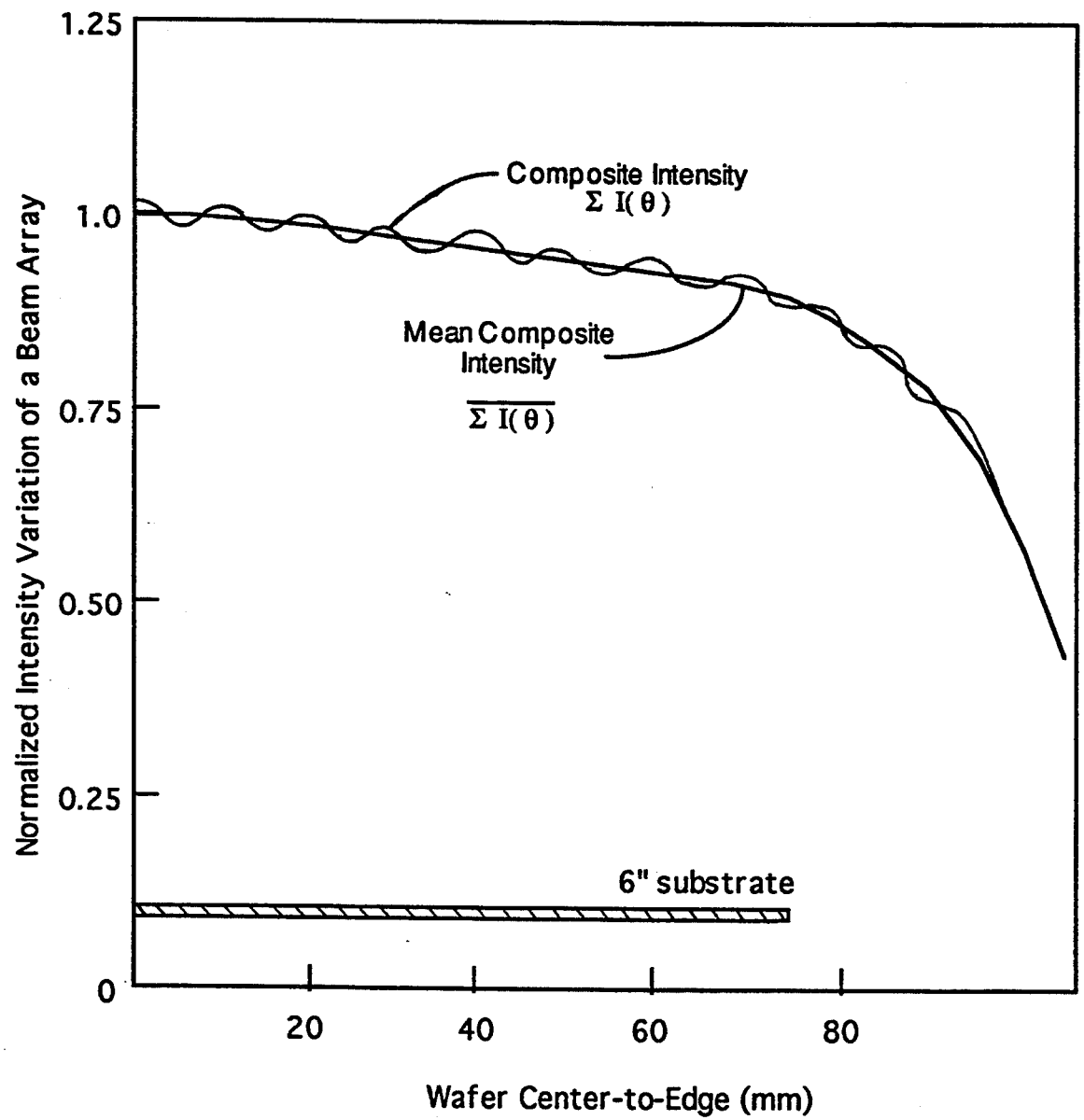
FIG. 9 is a graph of the species flux to the material surface from the channel array.

Composite intensity variations, and the mean composite intensity, over the substrate wafer predicted for an array of channels of 200 μm with an aspect ratio (L/a) of 10 and a 1.5 cm pitch spacing are shown in FIG. 9 for conditions of moderate driving pressure. If anisotropic etching or hot neutral transport into deep trenches and vias on the substrate surface is critical to the hot neutral beam array process, an increase in beam directionality is advantageous. Anisotropy could be increased by employing a smaller driving pressure behind the array, albeit at the expense of increasing the magnitude of the composite gas flux intensity variation or "ripple". In some extreme cases, wafer rotation may be advantageous to smooth out flux uniformity variations at the wafer surface. The adjustability of the inherent directionality of the beam array is useful since it allows efficient transport of reactive species into high aspect ratio structures on a substrate surface, where diffusional transport from an isotropic source is difficult.

Figure 10:
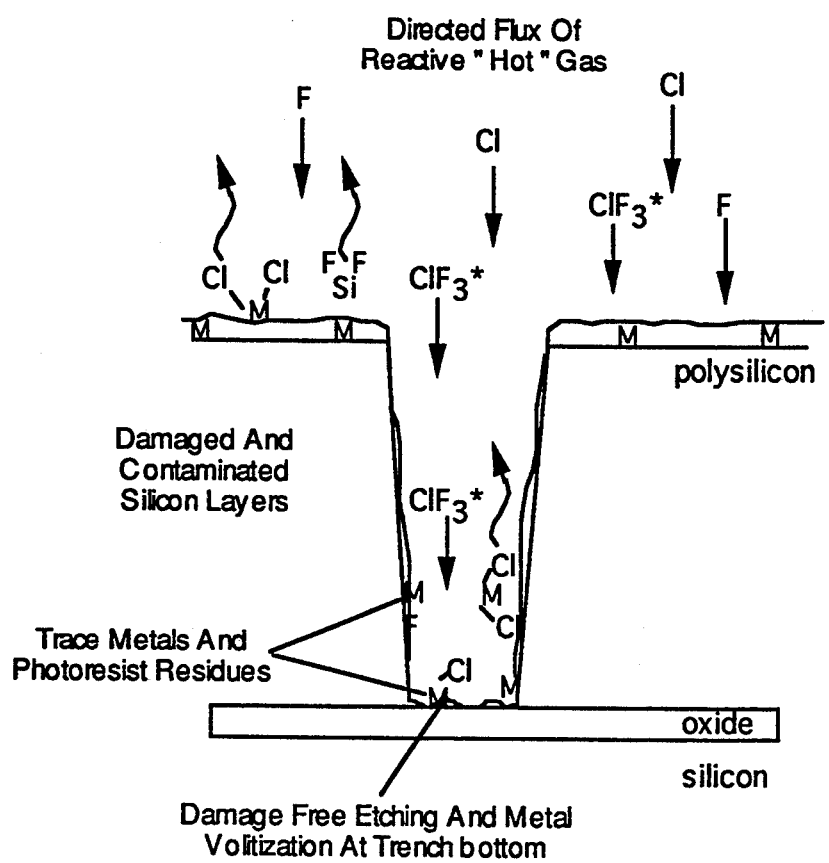
FIG. 10 is a diagram showing an ongoing hot chlorine trifluoride cleaning process conducted on a semiconductor wafer and utilizing the present invention.
Figure 11:
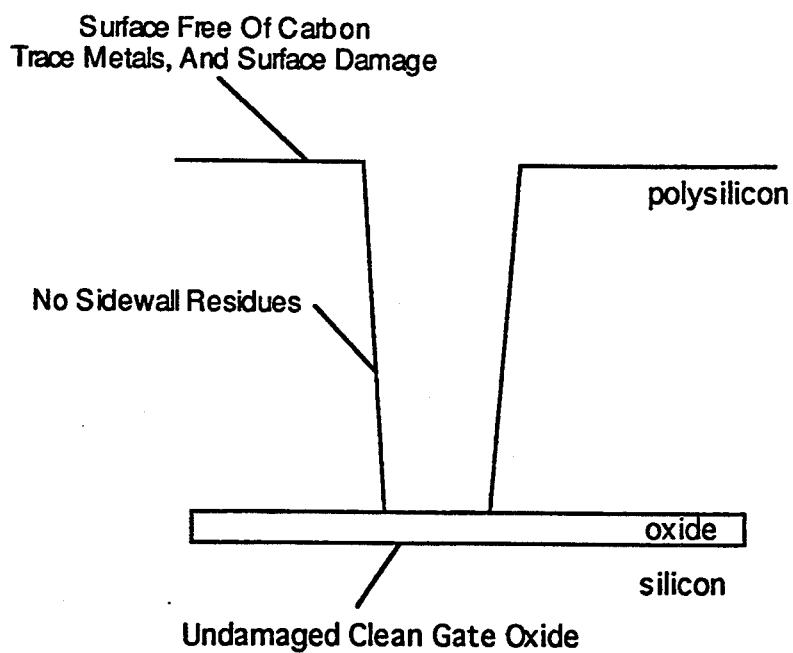
FIG. 11 is a schematic diagram showing the semiconductor wafer of FIG. 10 after the cleaning process has been completed.

There are a number of parent gases which may prove useful in the cleaning of semiconductor materials, in the removal of substrate surface damage layers, and in the chemical conditioning of material surfaces. A typical cleaning process is illustrated with reference to FIGS. 10 and 11. Here, a silicon surface which is contaminated with metals and damaged over several atomic layers due to previous process steps is exposed to $ClF_3$ gas beams, which may include thermally hot molecules $ClF_3^*$, atomic F, and atomic Cl. Metal contaminants (M) such as iron and copper form metal chlorides ($MCl_x$) which, under elevated substrate temperatures, are volatile in vacuum. Involatile contaminants may also be removed during etching of the substrate. The damaged silicon layers are slowly etched away through the formation of volatile silicon chlorides and fluorides, releasing trapped contaminants and revealing pristine surface layers. The directional nature of the gas beam allows cleaning of trench bottoms as well as planar surfaces. When the trench bottom is at or near a sensitive interface, such as a thin gate oxide layer, use of the hot neutral beam cleaning process of the present invention allows removal of the final silicon or residue layers without damage or etching of the underlying oxide layer. A number of potentially useful gases for the purpose of trace metal and/or damage removal over sensitive oxide layers include HCl, $ClF_3$, ClF, $Cl_2$, HF, $NF_3$, $SF_6$, $F_2$, $BrF_3$, $BrF_5$, $IF_5$, NO, $NH_3$, $H_2$, and mixtures thereof. Some organic materials such as n-alkanes and t-butyl peroxide form organic radicals when heated which can facilitate selective metal removal through formation of volatile organometallic compounds. Fluorine bearing gases are particularly useful in silicon oxide stripping processes. In many cases, the process may be designed to chemically condition the substrate surface by terminating surface bonds with a desired chemical species. For instance, $H_2$ or HF may be employed to produce a largely hydrogen terminated surface, while $O_2$ or $N_2$ will produce oxygen terminated or nitrogen terminated surfaces.

The interaction of Cl and F atoms with silicon, GaAs, and many metals has been well studied in the research environment. However, it has also been contended that vibrationally hot molecules such as $Cl_2^*$, $ClF_3^*$, and $NF_3^*$ will under some conditions etch semiconductor materials at appreciable rates. It must be recognized that the heating of a reactive gas will initially excite vibrational, rotational, and translational modes of the gas, increasing its reactivity, and resulting in increasing thermal dissociation of the gas into free radicals and/or atoms as the temperature increases. The fraction of dissociated free radicals versus hot molecular species in the gas beam may be estimated using standard thermochemical techniques. In general, the "hot" neutral beam chemistry may be comprised of a mixture of hot molecular and atomic species, one or the other of which may dominate the observed surface chemistry. When the surface reaction probability $\gamma$ of the hot gas beam species with given substrate or contaminant at a substrate temperature $T_s$ is known, the substrate material removal rate may be estimated via:

$$R \approx \gamma QC \; (\text{Å/min.}) \quad (20)$$

where Q is the total hot particle flux through the array and C is a constant to provide consistency of units. This estimate assumes the channel array is of similar size to the wafer and ignores divergence losses of active gas around the substrate wafer edges. The total particle flux Q is further related to the flow through each channel which is established by the array driving pressure P and the channel geometry:

$$Q = n_c N_{tot} = n_c \left(1 + \frac{3L}{8a}\right)^{-1} \iota^* f(p_r), \quad (21)$$

$$\iota^* = \left(\frac{nv}{4}\right)\pi \frac{a^2}{4}, \quad (22)$$

$$p_r = \frac{\sqrt{2} \, \pi \, \sigma^2 \, a \, P_s}{k_b T}, \quad (23)$$

$$f(p_r) = p_r^{-1}\left[\frac{\pi}{4} p_r + (1 - \pi/4) \ln(p_r + 1) + \frac{\pi}{128}\left[\frac{3}{2} p_r^2 + p_r^3 - (p_r^2 + 1)^{3/2} + 1\right]\right] \quad (24)$$

where $n_c$ is the total number of channels in the array and $P_S$ is the array driving pressure.

The anisotropy of the material removal is determined largely by the divergence of the hot gas beam array. However, deactivation mechanisms of hot molecular gas species on colder wafer surfaces may increase the directionality of etching. It may also be possible to use an isotropic background gas to assist in sidewall deactivation mechanisms or to limit sidewall etching rates through the formation of a protective layer. For instance, a small amount of $CH_3Br$ added to the chamber as a background gas may preferentially deposit an organic halide film on hot substrate feature sidewalls, while the trench bottom is more rapidly etched by the directed hot gas beam. Etching anisotropy may be improved in this manner. A mixture of gases such as $F_2$ and $Cl_2$ could also be used in the heated channel array itself to increase the substrate etching rates by catalytic effects of the dual atom chemistries as is observed in the etching of silicon and titanium.

To be useful for pattern transfer in a single wafer process, a material etching rate on the order of 1,000–10,000 Å/min. is necessary due to wafer throughput requirements. Thick silicon layers are typically not removed at a large enough rate to allow the use of pattern transfer etching processes in the present invention. In other cases, as in the hot $Cl_2$ etching of GaAs, the etching rates observed are rapid enough to facilitate pattern transfer. The 10–100 Å/min. silicon removal rates achievable are useful for the purposes of a finish or "soft" etching process to complete the removal of silicon over a thin gate oxide which would otherwise be damaged by plasma etching to completion. In addition, since the hot gas beam particles typically have a total translational energy < 1 eV and are electrically neutral, the small etching rates can be used to remove damaged substrate surface layers which have been damaged by particle bombardment or other plasma radiation effects.

Although etching rates achievable in this device may allow damage-free pattern transfer processes for some materials, the device will find greater applicability in the area of "light finish" etching to remove plasma surface damage layers, or to prevent the damage of thin gate oxide layers by plasma processes. In addition, silicon removal rates of 10–100 Å/min. are achievable in this device with many halogen-bearing gases, which is sufficient for gas-phase surface cleaning of bare or patterned silicon wafers. Use of an appropriate gas phase chemistry will in some cases allow selective volatization of surface contaminants such as trace metals or carbonaceous residues, while slowly etching the substrate surface to release trapped contaminants and remove damaged layers. Characteristics of the collisionally opaque gas hydrodynamic regime employed allow the formation of hot gas beams with "tunable" divergence so that active cleaning particles can be delivered in a more directed manner to reach deep trench bottoms, or a more disperse manner for the cleaning of sidewall residues. Applications of this invention are not limited to the removal of substrate material or contaminants, but may include chemical conditioning of the material surface or the production of deposition precursors.

Having described above the presently preferred embodiments of the present invention, it is to be understood that it may be otherwise embodied within the scope of the appended claims.

I claim:

1. An apparatus for processing large area substrates, including semiconductor wafers, utilizing a hot neutral gas beam, said apparatus comprising:

a processing chamber having a channel plate positioned therein and dividing said processing chamber into a high pressure reservoir on a first side of said channel plate and a vacuum chamber on a second and opposite side of said channel plate;

a first gas means for supplying a first parent gas to said high pressure reservoir;

a vacuum means connected to said processing chamber for generating a vacuum in said vacuum chamber;

channel plate heating means for heating said channel plate to a desired operating temperature;

said channel plate including a plurality of substantially perpendicular channels therein and each extending from said first side to said second side thereof, with said channels arranged in an array and spaced from each other, with the length of each channel substantially greater than the mean free path of the parent gas in said high pressure reservoir, and with the diameter of each channel no smaller than the mean free path of the parent gas in the high pressure reservoir;

control means for controlling the pressure in said high pressure reservoir, the temperature of said channel plate, and the vacuum in said vacuum chamber such that the parent gas molecules travel through said channels in a collisional flow in an upstream portion of said channels adjacent said high pressure reservoir and become activated through contact with said heated channel plate within said channels, such that activated parent gas molecules travel through a downstream portion of said channels adjacent said vacuum chamber to form a collimated beam wherein substantially no contact with said channel plate occurs, such that a transition region between the collisional flow in said upstream channel portion to the collimated flow in said downstream channel portion exists within each channel, and with the channels having a pressure gradient therein such that the pressure of the activated parent gas exiting the downstream channel portion has a mean free path no less than the length of the channel and substantially larger than the diameter of the channel; and a substrate support positioned within said vacuum chamber, substantially aligned with the second side of said channel plate, adapted to support a substrate thereon, and spaced from said channel plate by a distance not substantially greater than the mean free path of the parent gas in said vacuum chamber;

with the channels in said channel plate spaced from each other such as to generate a composite of the beams of activated, electrically neutral species of said parent gas directed toward said substrate support.

2. The apparatus of claim 1 wherein the channels in said channel plate are substantially uniformly spaced from each other and generate a substantially uniform composite of the beams of activated, electrically neutral species of said first parent gas.

3. The apparatus of claim 1 wherein said channel plate heating means is a continuous resistive trace carried by said channel plate and extending in a serpentine pattern thereabout and an electrical source for passing an electrical current through said resistive trace.

4. The apparatus of claim 1 wherein said channel plate heating means is a source of infrared radiation which is spaced from and irradiates said channel plate.

5. The apparatus of claim 4 wherein said source of infrared radiation is positioned outside of said processing chamber and irradiates said channel plate through an infrared transparent window in said processing chamber.

6. The apparatus of claim 1 wherein said channel plate is formed of a susceptor material and wherein said channel plate heating means is a current carrying coil spaced from said channel plate and generating electromagnetic radiation which induces electrical currents in said channel plate.

7. The apparatus of claim 1 wherein said channel plate is formed of an inert, pure, non-metallic material.

8. The apparatus of claim 1 wherein said channel plate is formed of a high purity ceramic material.

9. The apparatus of claim 1 wherein said channel plate is formed of a material selected from the group consisting of boron nitride, silicon carbide, aluminum oxide and graphite.

10. The apparatus of claim 1 further including a channel plate support for mounting said channel plate within said processing chamber and means for cooling said channel plate support.

11. The apparatus of claim 1 further including means for controlling the temperature of said substrate support.

12. The apparatus of claim 1 wherein said first parent gas is a halogen bearing gas.

13. The apparatus of claim 12 wherein said first parent gas is selected from the group consisting of $Cl_2$, HCl, $ClF_3$, $NF_3$, $SF_6$, $F_2$ and HF.

14. The apparatus of claim 1 further including a second gas means for additionally supplying a second parent gas to said high pressure reservoir, with said first and second parent gases forming a parent gas mixture in said high pressure reservoir.

15. The apparatus of claim 14 wherein said second parent gas is selected from the group consisting of oxygen, nitrogen and hydrogen.

16. The apparatus of claim 1 further including an auxiliary gas means for supplying, in an isotropic manner, a background gas to said vacuum chamber, with said background gas selected to improve the directionality of materials removed from a substrate through the formation of passivating sidewall layers and sidewall deposits, or otherwise effecting the substrate surface chemistry.

17. The apparatus of claim 1 further including a radiation shield positioned within said vacuum chamber and adjacent and substantially parallel with the second side of said channel plate, with said radiation shield including therein an array of channels which match the array of channels in said channel plate, but with each radiation shield channel having a slightly larger diameter than each channel plate channel.

18. The apparatus of claim 1 wherein said channel plate covers a surface area smaller than a substrate positioned therebeneath, and wherein said apparatus further includes a motion means for moving the substrate support to thereby position the entire substrate surface beneath said channel plate.

19. The apparatus of claim 18 wherein said motion means is a rotation means for rotating the substrate support about a central axis extending perpendicular to the opposite side of said channel plate.

20. The apparatus of claim 1 wherein said channel plate is segmented into at least two separate segments, and with each segment defining a separate gas reservoir having associated therewith its own gas means for supplying a particular parent gas to each gas reservoir, and further including motion means for moving the substrate support to sequentially position the entire substrate surface beneath each of said channel plate segments.

21. The apparatus of claim 20 wherein said motion means is a rotation means for rotating the substrate support about a central axis extending perpendicular to the opposite side of said channel plate.

22. The apparatus of claim 1 further including an ultraviolet laser generating an ultraviolet laser beam, and raster means for raster scanning said laser beam across the surface of a substrate to facilitate surface chemical reactions, substrate heating and particle removal during processing.

23. The apparatus of claim 1 wherein the pressure in said high pressure reservoir is between about 0.01 torr and about 10 torr, the diameter of each channel in said channel plate is between about 0.1 mm and about 0.5 mm, the aspect ratio (length/diameter) of each channel in said channel plate is between about 5 and about 20, and the channel density in said channel plate is between about $0.1/cm^2$ and about $10/cm^2$.

* * * * *

UNITED STATES PATENT AND TRADEMARK OFFICE
CERTIFICATE OF CORRECTION

PATENT NO. : 5,350,480
DATED : September 27, 1994
INVENTOR(S) : David C. Gray

It is certified that error appears in the above-indentified patent and that said Letters Patent is hereby corrected as shown below:

Column 3 Line 33 "( $\lambda$ A >> a," should read --( $\lambda$ >> a,--.

Column 13 Line 1 "tort" should read --torr--.

Column 16 Line 3 "$\Sigma$ I( $\theta$ )." should read --$\overline{\Sigma \text{ I}( \theta )}$.--.

Signed and Sealed this

Twenty-second Day of November, 1994

Attest:

BRUCE LEHMAN

Attesting Officer

Commissioner of Patents and Trademarks